United States Patent [19]

Yamamoto et al.

[11] Patent Number: 4,803,695
[45] Date of Patent: Feb. 7, 1989

[54] SEMICONDUCTOR LASER APPARATUS HAVING AN EXTERNAL REFLECTING MEANS

[75] Inventors: Osamu Yamamoto, Nara; Hiroshi Hayashi, Kyoto; Saburo Yamamoto, Nara, all of Japan

[73] Assignee: Sharp Kabushiki Kaisha, Osaka, Japan

[21] Appl. No.: 873,991

[22] Filed: Jun. 13, 1986

[30] Foreign Application Priority Data

Jun. 14, 1985 [JP] Japan ................. 60-130559

[51] Int. Cl.⁴ ............................................. H01S 3/19
[52] U.S. Cl. ...................................... 372/92; 357/19; 372/29; 372/49
[58] Field of Search ............... 372/92, 50, 36, 29, 372/32; 357/19

[56] References Cited

U.S. PATENT DOCUMENTS 4,338,577 7/1982 Sato et al. ............................. 372/36
4,675,873 6/1987 Miller .................................... 372/99

FOREIGN PATENT DOCUMENTS 0090485 10/1983 European Pat. Off. .
13017509 11/1980 Fed. Rep. of Germany .
13442188 5/1986 Fed. Rep. of Germany .
12301114 9/1976 France .
0111391 7/1983 Japan ................................... 372/44

OTHER PUBLICATIONS

Patent Abstracts of Japan, vol. 3, No. 36 (E-100), 27th Mar. 1979; & JP-A-54 14 180 (Canon K.K.) 02-02-1979.
Patent Abstracts of Japan, vol. 7, No. 218 (E-200) (1363), 28th Sep. 1983; & JP-A-58 111 391 (Hitachi Seisakusho K.K.) 02-07-1983.
Electronics Letters (21 Jul. 1983) vol. 19, No. 15, pp. 561-562.
IOOC 83 (4th) 1983.6.27-30, Tokyo, Japan, pp. 26-27.

Primary Examiner—James W. Davie
Attorney, Agent, or Firm—Ciotti & Murashige, Irell & Manella

[57] ABSTRACT

A semiconductor laser apparatus comprising a semiconductor laser device and a semiconductor device, both of which are fixed on a single mounting base with a spacing of several mm or less therebetween in such a manner that one of the side faces of said semiconductor device faces a laser-emitting facet of said semiconductor laser device in a parallel manner, the side face of said semiconductor device being a facet, at least a part of which is coated with a reflecting dielectric film functioning so as to have laser light from said semiconductor laser device return to said semiconductor laser device therefrom.

2 Claims, 1 Drawing Sheet

SEMICONDUCTOR LASER APPARATUS HAVING AN EXTERNAL REFLECTING MEANS

BACKGROUND OF THE INVENTION

1. Field of the Invention

This invention relates to a semiconductor laser apparatus attaining laser oscillation with a stabilized oscillation wavelength, which is useful in such fields as optical communication, optical measuring, optical information processing, etc.

2. Description of the Prior Art

With enlarged-applications of semiconductor lasers in such fields as optical communication, optical measuring, optical information, etc., semiconductor lasers are required to have a stabilized oscillation wavelength. The oscillation wavelength of conventional semiconductor lasers varies continuously or discontinuously with changes in temperatures and/or currents, resulting in optical output power noise. In order to solve these problems, semiconductor laser devices including diffraction grating type lasers (such as distributed feedback (DFB) lasers, distributed Bragg reflector (DBR) lasers, etc.), internal reflector interferometric lasers, compound resonator type lasers, external resonator type lasers, etc., have been developed so as to stabilize their oscillation wavelengths. However, they have the following drawbacks: Conventional diffraction grating type lasers such as DFB lasers, DBR lasers, etc., have a diffraction grating in the waveguide, which makes the production process complicated and it is difficult to use some semiconductor materials.

Conventional internal reflector interferometric lasers, which have different effective refractivities within the resonator thereof to produce an internal reflection resulting in an interference effect by which the selectivity of a longitudinal mode can be attained, lack reproducibility and cannot achieve a strong internal reflection, making it difficult to put them into practical use.

With conventional compound resonator type lasers including cleaved coupled cavity lasers (in which two semiconductor lasers are coupled by their facets and/or which are separated into two semiconductor lasers by an etching technique), the two semiconductor lasers operate independently, resulting in the synchronization of their wavelengths, making possible the stabilization of the oscillation wavelength. However, their operation relies upon the skill of skilled workers and precise control, otherwise small changes in the spacing between the two laser devices cause changes in the longitudinal mode, resulting in optical output power noise.

One conventional external resonator type laser is shown in FIG. 2, wherein a semiconductor laser device 1 is fixed on a mounting base 2 and laser light from the light-emitting front facet of the laser device 1 is radiated outside of the laser device 1 through a window 4. The mounting base 2 is fixed on the table 5 surrounded by the window 4 and the side walls 6. An external reflector 3 is also fixed on the table 5. A part of the laser light from the light-emitting rear facet of the laser device 1 is reflected by the external reflector 3 and returns to the laser device 1.

Due to the above-mentioned structure, the external longitudinal mode ($\lambda e = 2L/(m_e + \frac{1}{2})$), which is given by the distance L, between the light-emitting rear facet of the laser device 1 and the external reflector 3 occurs, so that the laser device 1 can stably oscillate only in the longitudinal mode around the peak at which the gain distribution of the internal longitudinal mode ($\lambda = 2nl/m$), given by the internal cavity length l of the laser device 1, is in accord with that of the external longitudinal mode ($\lambda e$), wherein m and $m_e$ are an integer and $\overline{n}$ is the effective refractivity of the semiconductor laser waveguide, and $\overline{n}l$ is nearly equal to from 2L to 20L. When n is equal to 4.0 and l is equal to 250 μm, the external cavity length L is set at a value in the range of 50 μm to 0.5 mm. As is well known, the interval $\Delta\lambda$ between the internal longitudinal modes is represented by the equation $\Delta\lambda = \lambda_0^2/2nl$, and the interval $\Delta\lambda e$ between the external longitudinal modes is represented by the equation $\Delta\lambda e = \lambda_0^2/2L$, wherein $\lambda_0$ is the oscillation wavelength. The longitudinal mode interval at which the internal longitudinal modes are in accord with the external longitudinal modes is in the range of 6 to 60 Å at an oscillation wavelength of about 7800 Å, and accordingly the laser device 1 stably oscillates in a longitudinal mode when the peak of the gain distribution is in the range of said difference in the wavelength. However, it is difficult to place the semiconductor laser device 1 on the mounting base 2 such that the light-emitting rear facet faces the external reflector in a parallel manner, and moreover the production process is complicated.

FIG. 3 shows another external resonator type laser which has a semiconductor chip 7, on the facet of which a metal film 8 made of Au, etc., which is disposed by an evaporation process, instead of the external reflector 3 used in the external resonator type laser shown in FIG. 2. The reflectivity of the metal film 8 with regard to laser light has an upper limit due to light absorption of the metal, and moreover the reflectivity tends to be reduced due to oxidation of the metal. Moreover, the semiconductor chip 7 only functions as a reflecting surface.

SUMMARY OF THE INVENTION

The semiconductor laser apparatus of this invention, which overcomes the above-discussed and numerous other disadvantages and deficiencies of the prior art, comprises a semiconductor laser device and a semiconductor device, both of which are fixed on a single mounting base with a spacing of several mm or less therebetween in such a manner that one of the side faces of said semiconductor device faces a laser-emitting facet of said semiconductor laser device in a parallel manner, the side face of said semiconductor device being a facet, at least a part of which is coated with a reflecting dielectric film functioning so as to have laser light from said semiconductor laser device return to said semiconductor laser device therefrom.

The semiconductor device functions, in a preferred embodiment, as a light detector detecting the intensity of laser light from said semiconductor laser device.

Thus, the invention described herein makes possible the objects of (1) providing a semiconductor laser apparatus which attains laser oscillation with a stabilized oscillation wavelength; (2) providing a semiconductor laser apparatus which functions to detect the laser light intensity; and (3) providing a semiconductor laser apparatus which can be readily produced.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

As an external reflector which reflects laser light from a semiconductor laser device to the semiconductor laser device, one facet of a semiconductor device positioned in the vicinity of the semiconductor laser device is used. The semiconductor device, which is made of Si or compound semiconductor materials, functions to drive the semiconductor laser device and/or to detect the intensity of laser light from the semiconductor laser device. At least a part of the facet of the semiconductor device is coated with a reflecting dielectric film having a high reflectivity, so that it can be easily placed in the vicinity of the facet of the semiconductor laser device in a parallel manner with an accurate distance therebetween, and moreover the stabilization of the oscillation wavelength can be achieved.

EXAMPLE

Figure 1:
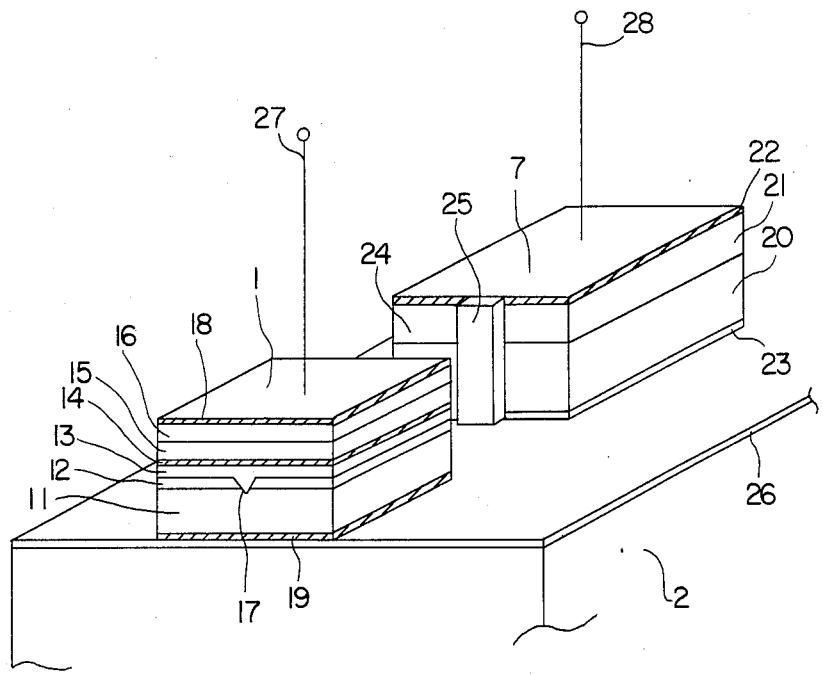
FIG. 1 is a perspective view showing a semiconductor laser apparatus of this invention.
Figure 2:
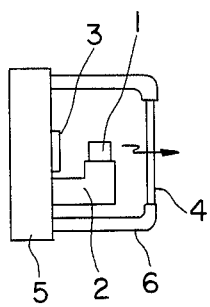
FIG. 2 is a diagram showing a conventional semiconductor laser apparatus.
Figure 3:
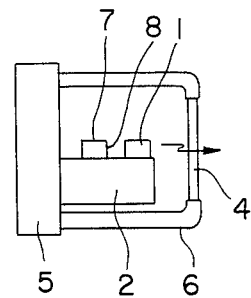
FIG. 3 is a diagram showing another conventional semiconductor laser apparatus.

FIG. 1 shows a semiconductor laser apparatus of this invention, which comprises a semiconductor laser device 1 and a semiconductor chip 7 both of which are fixed on a single mounting base 2 in such a manner that the light-emitting rear facet of the semiconductor laser device 1 faces the facet 24 of the semiconductor chip 7 in a parallel manner.

The semiconductor laser device 1 is produced as follows: On a p-GaAs substrate 11, an n-GaAs current blocking layer 12, a p-GaAlAs cladding layer 13, a GaAlAs active layer 14, an n-GaAlAs cladding layer 15, and an n-GaAlAs cap layer 16 are successively formed by liquid phase epitaxy, resulting in a double-hetero-structure multi-layered crystal for laser oscillation. Then, a V-striped channel 17 is formed in the current blocking layer 12 in a manner to reach the substrate 11, resulting in a current path. Then, an n-sided electrode 18 and a p-sided electrode 19 are formed on the upper face of the cap layer 16 and the back face of the substrate 11, respectively. The resulting semiconductor laser device 1 is fixed at a given position on the mounting base 2 by a solder 26 such as In, etc.

The semiconductor chip 7 which also functions as a photodetector comprises a p-GaAs layer 20, an n-GaAs layer 21 formed on the p-GaAs layer 20, an n-sided electrode 22 formed on the n-GaAs layer 21, and a p-sided electrode 23 on the p-GaAs layer 20. One of the side faces, which is a facet formed by cleavage, is a photodetecting face 24 facing the light-emitting rear facet of the semiconductor laser device 1. The photodetecting face 24 has a reflecting film 25 reflecting laser light from the semiconductor laser device 1. The reflecting film 25 is formed by coating the entire photodetecting face 24 or a part thereof with an $Al_2O_3$-amorphous Si multi-layered dielectric film by an electron beam evaporation process or the sputtering method.

The semiconductor chip 7 is positioned behind the semiconductor laser device 1 by the following process: The photodetecting face 24 of the semiconductor chip 7 is brought into contact with the light-emitting rear facet of the semiconductor laser device 1 which has been fixed at a given position on the mounting base 2, and then the semiconductor chip 7 is shifted to a given position on the mounting base 2 at which the semiconductor chip 7 is fixed by a solder 26 such as In, etc. Lead wires 27 and 28 made of Au or the like are connected to the n-sided electrodes 18 and 22, respectively.

Laser light from the rear facet of the semiconductor laser device 1 is effectively reflected by the reflecting film 25 facing the rear facet of the semiconductor laser device 1 in a parallel manner and returns to the semiconductor laser device 1, resulting in a laser light having a stabilized wavelength. On the other hand, the photodetecting face 24 of the semiconductor chip 7 which is not covered by the reflecting film 25 is irradiated with laser light from the semiconductor laser device 1, and accordingly the semiconductor chip 7 functions as a photodetector.

When driving current is injected from the n-sided electrode 18 and the p-sided electrode 19 into the semiconductor laser device 1 through the lead wire 27, it flows through the V-channel 17 alone so that stabilized laser oscillation begins in a transverse mode within the area of the active layer 14 positioned above the V-channel 17. Laser lights are emitted in the forward direction and the backward direction of the semiconductor laser device, respectively. The light emitted backward irradiates the photodetecting face 24 and the reflecting film 25 at a certain angle with regard to the optical axis of the semiconductor laser device 1 (i.e., approximately 20°-25° at one side with regard to the optical axis). Thus, when the distance between the light-emitting facet and the photodetecting face 24 is set to an appropriate value, the light irradiates over the whole area of the photodetecting face 24 including the reflecting film 25. A part of the light irradiating the reflecting film 25 is reflected by the reflecting film 25 and returns to the semiconductor laser device 1. The remainder of the light irradiating the area of the photodetecting face 24 except for the reflecting film 25 is photoelectrically converted into an electric signal, corresponding to the laser light intensity, by the semiconductor chip 7, which is then picked up through the lead wire 28.

Since the reflectivity of the reflecting film 25 is set at a high level, the laser light emitted to the reflecting film 25 is effectively reflected by the reflecting film 25 to return to the semiconductor laser device 1, and laser light having a stabilized wavelength is emitted from the front facet of the semiconductor laser device 1. The semiconductor chip 7 serves as a monitoring photodetector of the laser light from the front facet of the semiconductor laser device 1, so that control of driving current to be injected into the semiconductor laser device 1 can be attained by the electrical signal obtained from the semiconductor chip 7, which makes possible the control of the laser output intensity so that it can be maintained at a given level.

When the area of the photodetecting face 24 which is not covered by the reflecting film 25 is coated with another reflecting film having a low reflectivity, laser light is effectively incident upon the semiconductor chip 7 so that the photodetecting sensitivity of the semiconductor chip 7 can be enhanced.

In the case where the semiconductor chip 7 is positioned at a short distance from the semiconductor laser device 1 as mentioned in this example, if the whole photodetecting face 24 is coated with a reflecting film having an appropriate reflectivity, a part of the laser light irradiating the said reflecting film will return to the semiconductor laser device 1 and the remaining laser light will be incident upon the semiconductor chip 7 to thereby have the semiconductor chip 7 function as a photodetector. Moreover, when an integrated circuit device or the like composed of Si or compound semiconductor materials is positioned in the vicinity of the semiconductor laser device 1 in order to drive the semiconductor laser device 1, one of the facets of the integrated circuit device or the like can be used as a reflector.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser apparatus comprising a semiconductor laser device and a semiconductor device, both of which are fixed on a single mounting base with a spacing of several mm or less therebetween in such a manner that one of the side faces of said semiconductor device faces a laser-emitting facet of said semiconductor laser device in a parallel manner, the side face of said semiconductor device being a facet, at least a part of which is coated with a reflecting dielectric film functioning so as to have laser light from said semiconductor laser device return to said semiconductor laser device therefrom.

2. A semiconductor laser apparatus according to claim 1, wherein said semiconductor device functions as a light detector detecting the intensity of laser light from said semiconductor laser device.

* * * * *